(12) United States Patent
Groe et al.

(10) Patent No.: US 6,798,290 B2
(45) Date of Patent: Sep. 28, 2004

(54) TRANSLINEAR VARIABLE GAIN AMPLIFIER

(75) Inventors: John B. Groe, Poway, CA (US); Michael Farias, San Diego, CA (US)

(73) Assignee: Sequoia Communications, San Diego, CA (US)

(*) Notice: Subject to any disclaimer, the term of this patent is extended or adjusted under 35 U.S.C. 154(b) by 0 days.

(21) Appl. No.: 10/229,327

(22) Filed: Aug. 27, 2002

(65) Prior Publication Data

US 2003/0076169 A1 Apr. 24, 2003

Related U.S. Application Data

(60) Provisional application No. 60/316,768, filed on Aug. 31, 2001.

(51) Int. Cl.[7] .................................................. H03F 3/45
(52) U.S. Cl. ...................... 330/254; 330/252; 330/261; 327/103
(58) Field of Search ............................... 330/252–255, 330/259, 270, 261–264, 269, 277, 278, 300, 310; 327/103, 359, 478

(56) References Cited

U.S. PATENT DOCUMENTS

| | | | | |
|---|---|---|---|---|
| 5,006,818 A | * | 4/1991 | Koyama et al. | 330/261 |
| 5,030,923 A | * | 7/1991 | Arai | 330/254 |
| 5,289,136 A | * | 2/1994 | DeVeirman et al. | 330/252 |
| 5,399,990 A | * | 3/1995 | Miyake | 330/254 |
| 5,677,646 A | * | 10/1997 | Entrikin | 330/149 |
| 5,939,922 A | * | 8/1999 | Umeda | 327/333 |
| 5,949,286 A | * | 9/1999 | Jones | 330/254 |
| 5,990,740 A | * | 11/1999 | Groe | 330/252 |
| 5,994,959 A | * | 11/1999 | Ainsworth | 330/252 |
| 6,124,761 A | * | 9/2000 | Robinson et al. | 330/254 |
| 6,144,233 A | * | 11/2000 | Maruyama et al. | 327/77 |
| 6,188,280 B1 | * | 2/2001 | Filip | 330/252 |
| 6,246,289 B1 | * | 6/2001 | Pisati et al. | 330/254 |
| 6,333,675 B1 | * | 12/2001 | Saito | 330/133 |
| 6,445,251 B1 | * | 9/2002 | Robinson | 330/254 |
| 6,563,382 B1 | * | 5/2003 | Yang | 330/254 |
| 6,583,671 B2 | * | 6/2003 | Chatwin | 330/279 |

* cited by examiner

Primary Examiner—Timothy P. Callahan
Assistant Examiner—Hai L. Nguyen

(57) ABSTRACT

A translinear variable-gain amplifier. The translinear variable gain amplifier receives a differential input voltage and produces a differential output current having a selected gain. The amplifier comprises a buffer amplifier that receives the differential input voltage and produces a differential input current. The amplifier further comprises a translinear gain cell coupled to receive the differential input current and produce the differential output current. The gain cell includes a first adjustable bias source that operates to set a linear input range of the gain cell, and a second adjustable bias source that operates to set a gain value of the gain cell.

7 Claims, 4 Drawing Sheets

TRANSLINEAR VARIABLE GAIN AMPLIFIER

CROSS REFERENCE TO RELATED APPLICATIONS

This Application claims the benefit of priority of a U.S. Provisional Patent Application entitled "Translinear Variable Gain Amplifier" Serial No. 60/316,768 filed on Aug. 31, 2001, the disclosure of which is incorporated by reference herein in its entirety for all purposes.

FIELD OF THE INVENTION

The present invention relates generally to variable-gain amplifiers, and more specifically, to a translinear variable-gain amplifier.

BACKGROUND OF THE INVENTION

The signals received and transmitted in wireless communications systems often vary in strength and thus require the use of variable gain amplifiers in the radio transceiver. These variable gain amplifiers operate to remove fluctuations in the received signal and to compensate for path losses in the transmitted signal.

Ideally, the variable gain amplifier (VGA) provides amplification at low noise levels, adds little distortion, and consumes very little power. This is important because distortion produced by the receiver VGA limits its ability to reject interfering signals, while distortion produced by the transmitter VGA spills power into adjacent communication channels and thereby reduces system capacity. To minimize distortion, the bias current in the VGA and other circuits is typically high—an unwanted attribute for portable devices.

It would therefore be advantageous to have a VGA with low distortion and low power consumption.

SUMMARY OF THE INVENTION

The present invention includes a translinear variable-gain amplifier with adjustable gain and linearity. The amplifier operates over a wide control range, cascades easily, and allows broadband operation, while adding little distortion and consuming minimal power.

In one embodiment included in the present invention, a translinear variable gain amplifier is provided that receives a differential input voltage and produces a differential output current having a selected gain. The amplifier comprises a buffer amplifier that receives the differential input voltage and produces a differential input current. The amplifier further comprises a translinear gain cell coupled to receive the differential input current and produce the differential output current. The gain cell includes a first adjustable bias source that operates to set a linear input range of the gain cell, and a second adjustable bias source that operates to set a gain value of the gain cell.

In one embodiment included in the present invention, a variable gain amplifier with an adjustable linear input range and gain is provided. The amplifier comprises a pair of buffer amplifiers that receive differential input voltages and couple the input voltages to a pair of resistors that convert the input voltages to differential input currents. The amplifier also comprises a translinear gain cell coupled to receive the differential input currents and including a pair of diode-connected transistors and a first adjustable bias source. The first adjustable bias source used to set a linear input range. The translinear gain cell also includes a transistor differential pair and a second adjustable bias source that is operable to set a gain value of the translinear gain cell.

BRIEF DESCRIPTION OF THE DRAWINGS

The foregoing aspects and the attendant advantages of this invention will become more readily apparent by reference to the following detailed description when taken in conjunction with the accompanying drawings wherein.

DETAILED DESCRIPTION

Figure 1:
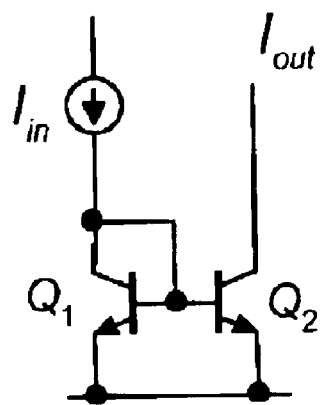
FIG. 1 shows a diagram of a current mirror circuit.

FIG. 1 shows a current mirror circuit that utilizes the translinear principle. In this circuit, the input current $I_{in}$ flows through transistor $Q_1$ and develops a base-emitter voltage ($V_{BE1}$) given by $$V_{BE1} = V_T \ln\left(\frac{I_{in}}{I_{S1}}\right)$$

where $V_T$ is the thermal voltage and $I_{S1}$ is the saturation current of transistor $Q_1$. The base-emitter voltage of transistor $Q_1$ is impressed upon or "mirrored" to the base-emitter junction of transistor $Q_2$, producing an output current $I_{out}$ equal to:

$$I_{out} = I_{S2} \exp\left(\frac{V_{BE2}}{V_T}\right)$$

Rearranging these equations yields the following translinear relationship:

$$J_{Q1} = J_{Q2}$$

where the current densities (J) of the transistors are $$J_{Q1} = \frac{I_{in}}{A_{e(Q1)}} \text{ and } J_{Q2} = \frac{I_{out}}{A_{e(Q2)}},$$

with the emitter area ($A_e$) of each transistor proportional to the saturation current ($I_S$).

Figure 2:
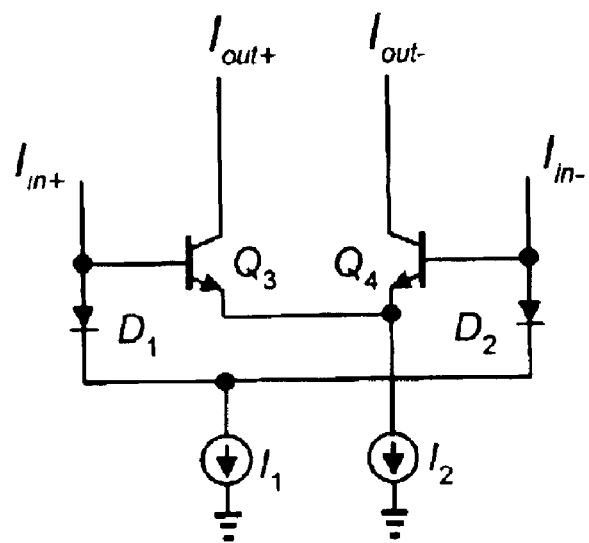
FIG. 2 shows a diagram of a current gain cell circuit.

FIG. 2 shows a current gain cell that also utilizes the translinear principle. In this circuit, the input currents $I_{in+}$ and $I_{in-}$ develop the following diode voltages:

$$V_{D1} = V_T \ln\left(\frac{I_{in+}}{I_S}\right)$$

$$V_{D2} = V_T \ln\left(\frac{I_{in-}}{I_S}\right)$$

In one embodiment, diodes $D_1$ and $D_2$ are formed using "matched" transistors—devices having identical dimensions and thus equal saturation currents—with their bases and collectors connected. The associated difference voltage $\Delta V_D$ is expressed as:

$$\Delta V_D = V_{D1} - V_{D2} = V_T \ln\left(\frac{I_{in+}}{I_{in-}}\right)$$

The circuit structure of the current gain cell mirrors this difference voltage to the inside differential pair consisting of matched transistors $Q_3$ and $Q_4$, thereby generating output currents that are related as follows:

$$\frac{I_{Q3}}{I_{Q4}} = \exp\left(\frac{\Delta V_{BE}}{V_T}\right)$$

where $\Delta V_{BE}$ is equal to $\Delta V_D$. Substituting the expression for $\Delta V_D$ into the above equation gives a current gain relationship expressed as:

$$\frac{I_{Q3}}{I_{Q4}} = \frac{I_{in+}}{I_{in-}}$$

which can be expressed in translinear form as $J_{D1}J_{Q3} = J_{D2}J_{Q4}$.

Diode currents $I_{D1}$ and $I_{D2}$ sum into bias current $I_D$. From this it follows that:

$$I_{D1} = \frac{I_D}{1 + \exp\left(-\frac{\Delta V_D}{V_T}\right)}$$

$$I_{D2} = \frac{I_D}{1 + \exp\left(\frac{\Delta V_D}{V_T}\right)}$$

Similarly, transistor currents $I_{Q3}$ and $I_{Q4}$ sum into bias current $I_G$, so that:

$$I_{Q3} = \frac{I_G}{1 + \exp\left(-\frac{\Delta V_{BE}}{V_T}\right)}$$

$$I_{Q4} = \frac{I_G}{1 + \exp\left(\frac{\Delta V_{BE}}{V_T}\right)}$$

Noting that $\Delta V_{BE}$ is equal to $\Delta V_D$, the following important input-output relationship results:

$$I_{Q3} = I_{in+}\left(\frac{I_G}{I_D}\right)$$

$$I_{Q4} = I_{in-}\left(\frac{I_G}{I_D}\right)$$

that clearly show that the bias current $I_G$ controls the gain of the current amplifier.

Figure 3:
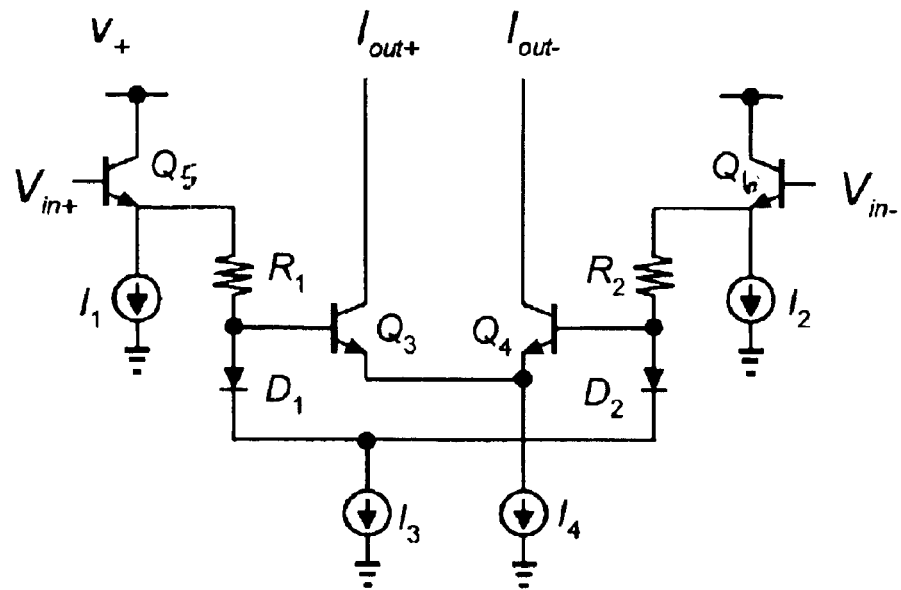
FIG. 3 shows a detailed schematic of one embodiment of a translinear VGA in accordance with the present invention.

FIG. 3 shows a detailed schematic diagram of one embodiment of a translinear variable gain amplifier (VGA) in accordance with the present invention. The current gain cell requires linear input currents, $I_{in+}$ and $I_{in-}$, to operate properly. These currents are formed in the VGA of FIG. 3. Transistors $Q_5$ and $Q_6$ form emitter-follower amplifiers that buffer and transfer the input voltages, $V_{in+}$ and $V_{in-}$, to resistors $R_1$ and $R_2$. The resistors convert the input voltages to linear currents that feed the current gain cell. Thus, the transistors $Q_5$, $Q_6$ and resistors $R_1$ and $R_2$ form a buffer circuit that receives differential input voltages and produces differential input currents for input to the gain cell.

The differential input voltage $\Delta V_{in}$ develops the following voltage drops:

$$\Delta V_{in} = V_{in+} - V_{in-} = (V_{BE5} - V_{BE6}) + R(I_{D1} - I_{D2}) + (V_{D1} - V_{D2})$$

where the value of resistors $R_1$ and $R_2$ is R. The terms $(V_{BE5} - V_{BE6})$ and $(V_{D1} - V_{D2})$ are designed to be comparatively small, thus the above the expression can be rewritten as:

$$I_{D1} - I_{D2} \approx \frac{\Delta V_{in}}{R}$$

Furthermore;

$$\Delta I_{out} = I_{Q3} - I_{Q4} \approx \frac{I_G}{I_D}\left(\frac{\Delta V_{in}}{R}\right)$$

where transistor currents $I_{Q3}$ and $I_{Q4}$ are $I_{out+}$ and $I_{out-}$ respectively. This is a fundamental expression for the translinear variable gain amplifier.

Figure 4:
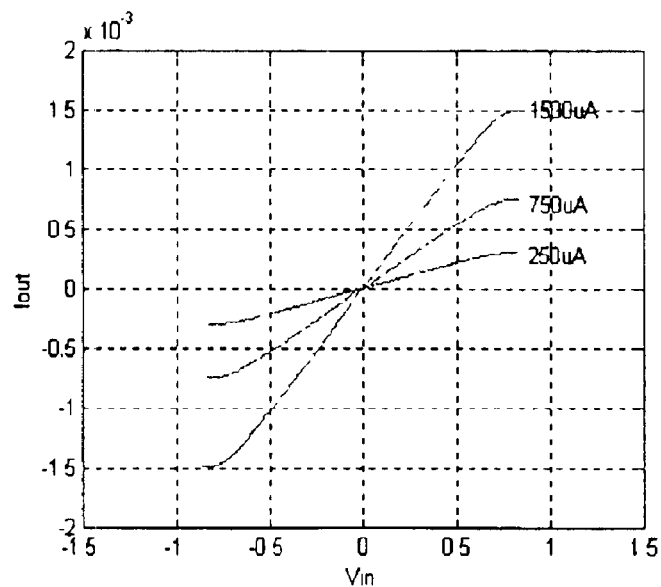
FIG. 4 illustrates that the gain of the translinear VGA is easily adjusted by the bias current $I_G$.
Figure 5:
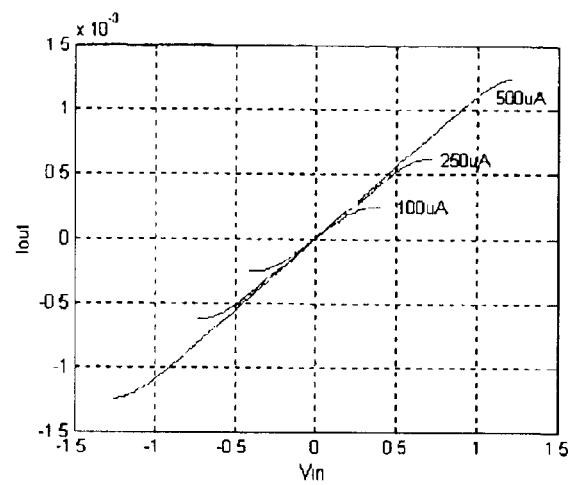
FIG. 5 illustrates that the linear input range of the translinear VGA is easily adjusted by the bias current $I_D$.

FIG. 4 shows transfer function curves that illustrate how the gain of the translinear VGA is set by the adjustable bias current $I_G$. The linear input range of the translinear variable gain amplifier (VGA) is set by the adjustable bias current $I_D$ along with resistors $R_1$ and $R_2$. The linear input range is effectively limited to a maximum value of $V_{in(max)} = I_D R$ as illustrated in the transfer function curves of FIG. 5.

Figure 6A:
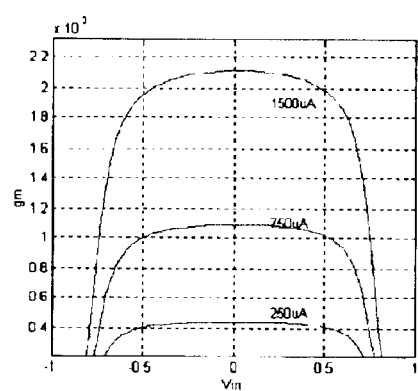
FIGS. 6a–b illustrate the effective linearity of the translinear VGA.
Figure 6B:
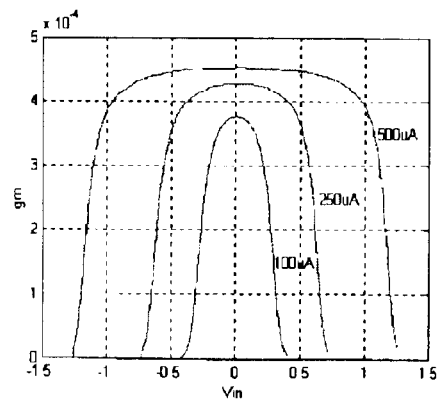

FIGS. 6a–b illustrate the effective linearity of the translinear VGA. The gain of the translinear VGA is defined in terms of the transconductance parameter $g_m$, defined as $$g_m = \frac{\partial I_{out}}{\partial V_{in}}.$$

It's fairly constant near $V_{in} = 0$, but falls off as $V_{in}$ approaches $V_{in(max)}$. This illustrates the actual linearity of the translinear VGA, since gm is ideally constant and flat.

Figure 7:
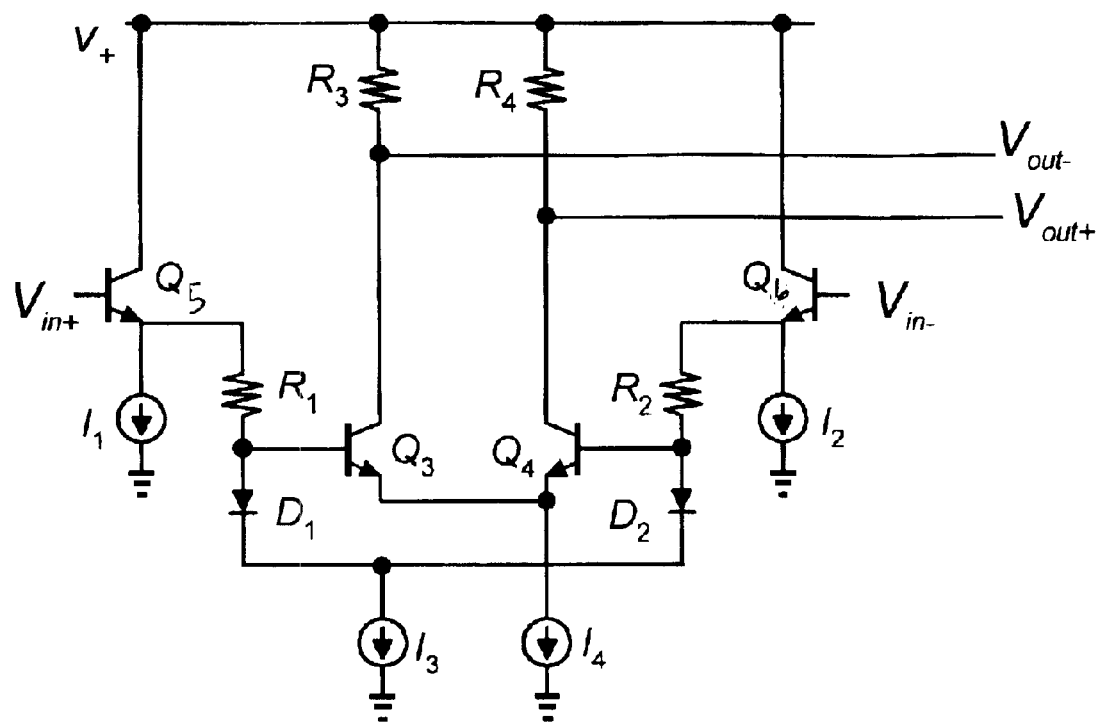
FIG. 7 shows a detailed schematic of another embodiment of the translinear variable gain amplifier in accordance with the present invention.

FIG. 7 shows a detailed schematic of another embodiment of the translinear variable gain amplifier in accordance with the present invention. In many applications, a wide range of gain control is needed—wider than the range available from a single VGA stage. For these applications, multiple VGA stages like the one shown in FIG. 7 can be used. The circuit of FIG. 7 is an extension of the translinear VGA of FIG. 3 and easily interfaces to additional similar stages. The amplifier structure converts the output currents to a differential voltage ($V_{out+}$, $V_{out-}$) that can be directly connected to the next stage, enabling broadband operation from DC to GHz frequencies. Thus, the translinear VGA provides gain and linearity control, allowing optimum performance at minimum power consumption.

The VGA is ideally suited for RF transmitters. Its power consumption tracks the RF output power level, which is set by a control signal. In one embodiment, a VGA constructed in accordance with the present invention is included in an RF transmitter circuit of a radio communication device. Because of its low power consumption, the VGA is ideally suited for use in portable radio communication devices, such as cell phones, PDAs, portable computers, and other handheld communication devices.

The embodiments described herein are illustrative of the present invention and are not intended to limit the scope of the invention to the particular embodiments described.

Accordingly, while one or more embodiments of the invention have been illustrated and described, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. A variable gain amplifier with an adjustable linear input range and gain, comprising:
   a pair of buffer amplifiers that receive differential input voltages and couple the input voltages to a pair of resistors that convert the input voltages to differential input currents; and
   a translinear gain cell coupled to receive the differential input currents at a pair of diode-connected transistors that are connected to a first adjustable bias source, the first adjustable bias source is operable to set a linear input range, the translinear gain cell also comprising a transistor differential pair that are coupled to a second adjustable bias source that is operable to set a gain value of the translinear gain cell.

2. In a communication transceiver, a translinear variable gain amplifier included in an RF transmitter circuit of the transceiver, the amplifier comprising:
   a buffer amplifier that receives the differential input voltage and produces a differential input current; and
   a translinear gain cell coupled to the receive the differential input current and produce the differential output current, the gain cell comprises a pair of diode-connected transistors that receive the differential input current and are connected to a first adjustable bias source that operates to set a linear input range of the gain cell, and the gain cell comprises a second adjustable bias source that operates to set a gain value of the gain cell.

3. A translinear variable gain amplifier that receives a differential input voltage and produces a differential output current, wherein the amplifier is operable to provide an adjustable linear input range and gain, the amplifier comprising:
   a buffer circuit that receives the differential input voltage and produces a differential input current; and
   a translinear gain cell coupled to the receive the differential input current and produce the differential output current, the gain cell comprises a pair of diode-connected transistors that receive the differential input current and are connected to a first adjustable bias source that operates to set a linear input range of the gain cell, and the gain cell comprises a second adjustable bias source that operates to set a gain value of the gain cell.

4. The translinear variable gain amplifier of claim 3, wherein the buffer circuit comprises first and second transistors, and first and second resistors, that operate to convert the differential input voltage to the differential input current.

5. The translinear variable gain amplifier of claim 3, wherein the gain cell includes a transistor differential pair coupled to the second adjustable bias source.

6. The translinear variable gain amplifier of claim 3, further comprising a current to voltage converter that receives the differential output current and produces a differential output voltage.

7. The translinear variable gain amplifier of claim 6, wherein the differential output voltage is coupled to a second translinear variable gain amplifier.

* * * * *